Dec. 24, 1963 R. A. HARRIS 3,115,601

BALANCED DRIVE FOR SEMICONDUCTOR DIODE ATTENUATOR IN AUTOMATIC GAIN CONTROLLED AMPLIFIER

Filed Jan. 5, 1960 2 Sheets-Sheet 1

INVENTOR

Ralph A. Harris

BY Stevens, Davis, Miller & Mosher

ATTORNEYS

INVENTOR
Ralph A. Harris
BY Stevens, Davis, Miller & Mosher
ATTORNEYS

United States Patent Office 3,115,601
Patented Dec. 24, 1963

3,115,601

BALANCED DRIVE FOR SEMICONDUCTOR DIODE ATTENUATOR IN AUTOMATIC GAIN CONTROLLED AMPLIFIER

Ralph A. Harris, Houston, Tex., assignor to Texas Instruments Incorporated, Dallas, Tex., a corporation of Delaware Filed Jan. 5, 1960, Ser. No. 654
7 Claims. (Cl. 323—66)

Figures 1A, 1B, 1C, 1D, 2:
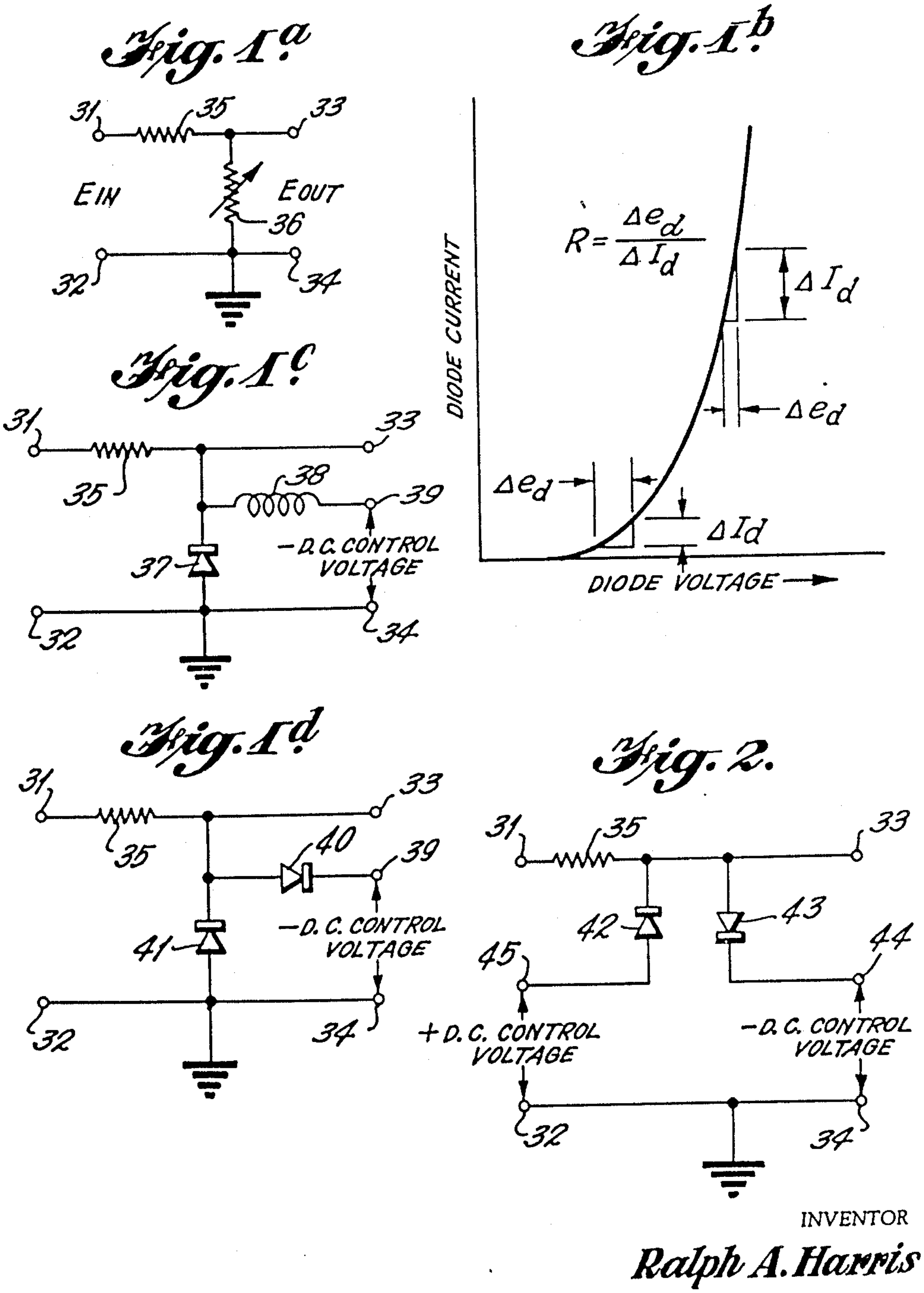

This invention relates to seismic amplifiers with automatic gain control and more particularly to semiconductor diode attenuators in such amplifiers.

Automatic gain control of an amplifier can be accomplished by two general methods. One method varies the gain of the amplifier stages. This usually takes the form of varying the grid bias in vacuum tube gain stages or the bias current in transistor gain stages. The other method uses fixed gain stages and one or more variable attenuators in the signal path. A combination of the two methods is sometimes used. One popular transistor radio circuit uses a combination of variable bias current in the I.F. amplifier and a diode attenuator at the output of the mixer.

The method of variable bias as a means of gain control has been widely used in radio circuits and it is very successful in this use. The greatest disadvantages of this method are: (1) it is a source of distortion; and (2) variations of bias are amplified and appear in the output. These variations are usually slow and appear as signal axis shifts at very low frequencies in the output.

In radio receivers, the automatic gain control is usually made to operate on the R.F. and I.F. stages. Since these stages are followed by tuned circuits, the low frequency signals caused by the variable bias cannot get through the remainder of the receiver. These tuned circuits also remove the distortion of the carrier waveform caused by automatic gain control.

In a seismic amplifier, which must operate at low frequencies, there is nothing to remove these signal axis shifts. There also exists a problem of preventing oscillation. To provide automatic gain control, the output signal from the amplifier normally is rectified and filtered. The filtered D.C. voltage is used to control the gain. In a seismic amplifier, because of its low frequency characteristics, some ripple will exist in the filtered D.C. control voltage. When the filtered D.C. voltage is applied to control the gain of the amplifier, this ripple will be amplified by the seismic amplifier and appear in the output from the seismic amplifier. The amplified ripple will be applied to the rectifier and filter increasing the ripple in the D.C. control voltage. The action is thus cumulative and if the gain is sufficient, the amplifier will oscillate at a frequency determined by the filter and the low frequency characteristics of the amplifier.

In the circuit of the invention, fixed gain stages are used with one or more variable diode attenuators and a balanced drive system for the attenuators. With this circuit, low frequency oscillation and signal axis shift are prevented.

Briefly, according to the invention, the output signal from the seismic amplifier is amplified and rectified to provide a negative D.C. voltage proportional to a weighted average of the output signal taken over a brief period of time. A converting circuit is provided which generates a positive D.C. voltage of the same amplitude as the negative D.C. voltage. The positive D.C. voltage is connected to the negative D.C. voltage through semiconductor diodes connected in series. The diodes have polarities such that current flows in the forward direction from the positive D.C. voltage to the negative D.C. voltage. The junction between the diodes is directly connected to a point in the signal channel of the seismic amplifier. The diodes have dynamic resistances which vary with the amount of current flowing through them and, therefore, in accordance with the amplitude of the output signal of the amplifier. These variable dynamic resistances provide variable attenuation in the signal channel of the amplifier. The attenuation increases when the output signal increases and decreases when the output signal decreases. Thus, automatic gain control is effected. Because the D.C. voltages applied to the series connected diodes are equal and opposite, the junction between the diodes will not change with changes in the D.C. voltages and, therefore, there will be no axis shift or ripple introduced into the signal channel of the amplifier by the D.C. control voltages.

Figure 3:
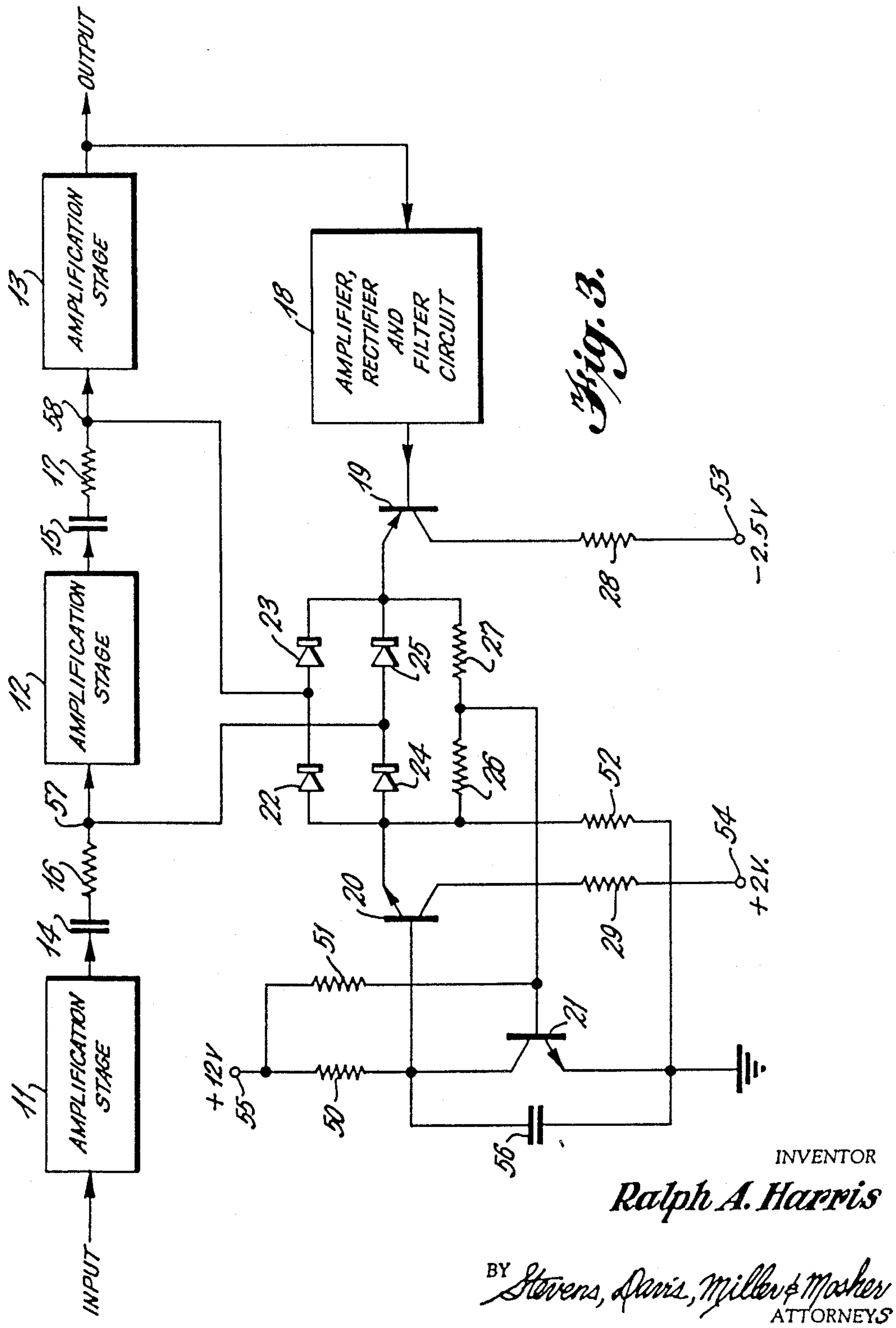

Further objects and advantages of the invention will become readily apparent as the following detailed description of the preferred embodiment unfolds and when taken in conjunction with the drawings wherein:

FIGURES 1*a*, 1*b*, 1*c*, and 1*d* illustrate how attenuators are used to provide variable gain control;

FIGURE 2 illustrates a diode attenuator of the type used in the present invention; and FIGURE 3 illustrates the overall system of the invention.

The attenuator used in the invention is of an L pad configuration. FIGURE 1A shows the basic idea of the attenuator. The input voltage $E_{in}$ is applied across terminals 31 and 32 and the output voltage $E_o$ is taken from terminals 33 and 34. A resistor 35 having a value $R_1$ connects the input terminal 31 to the output terminal 33. The terminals 32 and 34 are grounded and a variable resistor 36, the resistance of which is designated R, is connected across the output terminals 33 and 34. The output voltage is related to the input voltage by the formula:

$$E_o=\frac{RE_{in}}{R+R_1}$$

Thus, the output voltage is determined by R. If R is an open circuit, the output will be equal to the input and there will be no attenuation. If R is very small compared to $R_1$, the output will be very small and the attenuation will be large. In order to accomplish automatic gain control action, the output of the amplifier is rectified and filtered to obtain a D.C. voltage. This D.C. voltage controls the value R. The non-linear voltage current characteristics of diode can be used as the variable R. These can be either vacuum tube or semiconductor diodes. The preferred embodiment of the invention makes use of semiconductor diodes.

The curve of FIGURE 1B shows the forward voltage current characteristics of a semiconductor diode. For very low voltages, the current is almost zero. As the voltage increases, the current begins to increase. The current increases very slowly at first. Its rate of increase continues to go up with the increase of voltage until the diode is saturated.

When employed within the circuits of this invention, adjustment is made such that the A.C. signal voltage across the diode will be very small compared to the D.C. voltage thereacross. Consequently, the A.C. signal voltage can be considered as a small variation of the D.C. voltage. A small change of D.C. voltage is shown as $\Delta e_d$. A corresponding small change of current is shown as $\Delta I_d$. The dynamic resistance R, which the A.C. signal voltage sees is $$\frac{\Delta e_d}{\Delta I_d}$$

or in other words, the slope of the curve. As shown on the curve, the value of this R depends on the value of the static D.C. voltage. For a large D.C., the change of current is very large compared to the change of voltage. Thus, R has a very small value. For small values of D.C., the change of current is very small compared to the change of voltage. Thus, R has a very large value. Thus, R can be made anything between a few ohms and several megohms, and the diode can serve very well as the variable resistance portion of the attenuator.

If one diode is used in place of resistor 36 in FIGURE 1A, the source of D.C. voltage to control the attenuation will be a shunt path around the diode and prevent proper operation. This objection can be overcome by supplying the D.C. through an inductor which would have high impedance at the signal frequency. Such a circuit is shown in FIGURE 1C. In this circuit, a diode 37 replaces the resistor 36. The D.C. control voltage is applied between a terminal 39 and ground, and an inductor 38 connects the D.C. control voltage across the diode 37. The D.C. control voltage polarity is selected to cause current flow in the diode in the forward direction. When the D.C. control voltage is increased, the D.C. current through the diode 37 will increase and the dynamic resistance R will decrease and vice versa.

This circuit has several disadvantages. The inductor 38 prevents rapid change of the D.C. current in the diode and thus places an upper limit on the speed of automatic gain control action. For the low frequencies of a seismic amplifier the value of the inductor 38 would have to be large, and would, therefore, be a heavy, bulky, and expensive component. The D.C. voltage across the diode is applied directly to the attenuator output. The amplifiers which follow the attenuator are A.C. coupled, and will not pass the D.C. However, the low frequency variations of the D.C. voltage will be amplified. Since the signal is very small compared to the D.C. voltage, these variations of D.C. voltage in the output will be larger than the signal.

Some of the disadvantages of the circuit of FIGURE 1C can be overcome by means of the circuit of FIGURE 1D. In this circuit, two diodes 40 and 41 are connected in series across the D.C. control voltage applied between the terminal 39 and ground. The diodes 40 and 41 are connected so that current flows through them in the forward direction. The junction between the diodes 41 and 40 is connected to terminal 33. If the source impedance of the D.C. control voltage is small, the two diodes 40 and 41 are effectively in parallel for attenuator action. The D.C. control voltage must be twice as large as in the circuit of FIGURE 1C. While the circuit of FIGURE 1D eliminates the disadvantages of an inductor in circuit with the D.C. control voltage, it nevertheless still has the disadvantage that the control voltage is applied to the output of the attenuator.

This last mentioned disadvantage is eliminated in the circuit of FIGURE 2. In this circuit the variable resistance R is provided by two diodes 42 and 43. Two equal D.C. control voltages of opposite polarity are developed and applied to terminals 44 and 45. Diodes 42 and 43 are connected in series between the terminals 44 and 45 so that current flows through them in the forward direction. The junction between diodes 42 and 43 is connected to the output termianl 33. If the two diodes 42 and 43 are selected to have identical characteristics and the two D.C. control voltages are exactly equal but have opposite polarities, there will be no D.C. voltage appearing at the output of the attenuator. It is this attenuator and the system for generating two equal but opposite sources of D.C. control voltage that forms the basis of this invention.

If, instead of two equal and opposite control voltages, a single balanced ungrounded control voltage is applied across terminals 44 and 45 and equal resistors are connected from terminal 45 to ground and from terminal 44 to ground, the circuit is then a balanced bridge and no D.C. voltage will appear at the output of the attenuator. An ungrounded D.C. control voltage can be obtained by using a transformer at the output of the amplifier. The secondary voltage of the transformer can be rectified, filtered, and applied to the diodes. While this scheme is very simple, it has two disadvantages. The transformer, to be good to the low frequencies used, would have to be large and expensive. Since the diodes are low impedance devices, the filter would have to be of low impedance. If an RC filter is used, the series R would have to be small. This means the capacitors of the filter would have to be extremely large.

To avoid the necessity of using these expensive components, the circuit of the preferred embodiment of the applicant's invention generates two equal and opposite D.C. control voltages, which are applied between ground and the terminals 44 and 45 in FIGURE 2. FIGURE 3 illustrates the complete circuit as incorporated in a seismic amplifier.

As shown in FIGURE 3, the input signal is amplified by three amplification stages 11, 12 and 13. The output of the amplification stage 11 is applied to the input of the amplification stage 12 over a series circuit of a capacitor 14 and a resistor 16, and the output of the amplification stage 12 is applied to the input of the amplification stage 13 over a series circuit of a capacitor 15 and a resistor 17. The circuit point at the input to the amplification stage 12 is designated by the reference number 57 and the circuit point at the input to the amplification stage 13 is designated by the reference number 58. The junction between a pair of series connected semiconductor diodes 22 and 23 of substantially identical characteristics is connected to circuit point 58 and the junction between a pair of series connected semiconductor diodes 24 and 25 of substantially identical characteristics is connected to circuit point 57.

The resistor 16 and the diodes 24 and 25 comprise components of one attenuator for the seismic amplifiers, with the resistor 16 corresponding to the resistor 35, and the diodes 24 and 25 corresponding to the diodes 42 and 43 in the circuit of FIGURE 2. The resistor 17, together with diodes 22 and 23, comprise components of another attenuator for the seismic amplifier with the resistor 17 and the diodes 22 and 23 corresponding to the resistor 35 and the diodes 42 and 43, respectively, in the circuit of FIGURE 2.

The output of the amplification stage 13, which is the output of the seismic amplifier, is amplified, full-wave rectified, and filtered by circuit 18 to provide a negative D.C. voltage proportional to a weighted average over a small period of time of the amplitude of the output signal from the seismic amplifier. This negative voltage is applied to the base of a PNP transistor 19. The collector of the transistor 19 is connected over a resistor 28 to a D.C. supply voltage of minus 2.5 volts at terminal 53.

The transistor 19 will produce at its emitter, a voltage almost equal to the D.C. output voltage from the circuit 18. Circuit means are provided to generate a positive D.C. voltage at the emitter of an NPN transistor 20, equal in amplitude to the D.C. voltage generated at the emitter of the transistor 19. The emitter of transistor 20 is connected to the emitter of the transistor 19 over three circuits connected in parallel. One of these circuits comprises the series circuit of the semiconductor diodes 22 and 23. Another of these circuits comprises the series circuit of the semiconductor diodes 24 and 25. The third of these circuits comprises resistors 26 and 27 of equal value connected in series.

The collector of the transistor 20 is connected over resistor 29 to a D.C. supply voltage of plus 2.5 volts at terminal 54. The emitter of the transistor 20 is connected to ground by means of a resistor 52. The junction between the resistors 26 and 27 is connected to the base of an NPN transistor 21. The emitter of the transistor 21 is connected to ground and the collector of the transistor 21 is connected over a resistor 50 to a D.C. supply voltage of plus 12 volts at a terminal 55. The terminal 55 is also connected to the base of the transistor 21 by means of the resistor 51. The collector of the transistor 21 is connected to the base of transistor 20. The collector of the transistor 21 is also connected to ground over a capacitor 56 to prevent high frequency oscillation.

In the absence of any output signal from the amplification stage 13, there will be no output voltage generated from the circuit 18 and the voltage applied at the base of the transistor 19 will be essentially zero or ground potential. The emitter of the transistor 19, therefore, will also be essentially at ground potential. The transistor 21 will be saturated due to the connection from the twelve volts at terminal 55 to the base of the transistor 21. Therefore, the collector of the transistor 21 will be near ground potential. Since the voltage at the collector of the transistor 21 is applied to the base of transistor 20, the base of the transistor 20 will also be at approximately ground potential.

When an output signal is generated from the amplification stage 13, a negative voltage proportional to the amplitude of this signal will be applied to the base of the transistor 19. The emitter of the transistor 19 will, therefore, assume a negative voltage almost equal to the output voltage of circuit 18. Therefore, because the resistor 27 connects the base of transistor 21 to the emitter of transistor 19, the base of the transistor 21 will move in a negative direction. This action will cause the collector voltage of the transistor 21 to become more positive, which in turn causes the emitter of the transistor 20 to become more positive. The emitter voltage of the transistor 20 will be driven in this manner to a positive voltage equal in amplitude to the negative voltage at the emitter of the transistor 19. If the positive emitter voltage of the transistor 20 does not equal the amplitude of the negative voltage at the emitter of the transistor 19, fifty percent of the difference will appear as an error signal at the junction of the resistors 26 and 27. This error signal is applied to the base of the transistor 21 and is amplified and inverted by the transistor 21 and applied to the base of the transistor 20. The inversion of the error signal makes the error signal in the proper direction to correct the error and thus the emitter voltage of the transistor 20 will have the same amplitude as the emitter voltage of the transistor 19. The transistor 21 is connected to have a high gain to insure that the emitters of the transistors 19 and 20 move very nearly the same amount in opposite directions. Since the emitter of the transistor 20 is made positive by the same amount that the emitter of the transistor 19 is negative, the D.C. level of the junctions between the diodes 22 and 23 and between the diodes 24 and 25, which act as voltage dividers, will be maintained at zero or ground.

The transistors 19 and 20 are connected as emitter followers and as such they satisfy the requirement that the D.C. control voltages applied to the attenuator have low source impedances. When the D.C. voltage is very small, the current through the diodes will be very nearly zero. This can be seen by reference to FIGURE 1B. Under these conditions, there would be essentially no current in transistors 19 and 20. They would then not function very well as emitter followers and their output impedance would not be low under these conditions. However, the path from terminal 55 through resistor 51 and resistor 27 to the emitter of transistor 19 provides current to the transistor 19. Thus, it will always have some current flow and be operating properly. This flow of current could pull the emitter of transistor 20 positive and cut it off. The resistor 52 prevents this, as it is small compared to the resistor 51. The resistor 52 also provides a current path to supply current to transistor 20 when the diodes are not conducting.

When a signal is applied to the input of the amplifier, a large signal will appear at the output due to the large amount of gain in the amplifier. This output signal is amplified, full wave rectified, and then filtered by the circuit 18 to provide a nearly ripple free negative D.C. voltage. This D.C. voltage is applied to the balanced drive circuit at the base of transistor 19. This produces a D.C. voltage across the diodes. This voltage, as shown by FIGURE 1B, will cause the diodes to have a small dynamic resistance. The small resistance results in a large amount of attenuation in the amplifier. Thus, the signal is attenuated to bring down the output signal voltage of the amplifier. The length of time required to bring the output down is determined by the time constant of the filter of circuit 18. If the input to the amplifier remains at a constant level, the output of the amplifier will reach a constant level. If the signal increases in amplitude, the output will increase. This provides more D.C. to the diodes which decreases their dynamic resistance and increases the attenuation. This pulls the output of the amplifier back down to nearly the same value. Conversely, if the input signal decreases in amplitude, the output will decrease. This will decrease the D.C. voltage across the diodes. This action increases their resistance and decreases the attenuation, to cause the output to go back up to very nearly the original value. As shown in FIGURE 1B, it takes only a small change of D.C. voltage to vary the dynamic resistance over a wide range. Therefore, the output of the amplifier will be kept very nearly constant. The output voltage will increase less than two to one for input signal increases of 10,000 to 1.

The balanced drive, which provides equal and opposite voltages at the emitters of transistors 19 and 20, prevents signal axis shift and oscillation at a low frequency. If the drive were not balanced, there would be a D.C. voltage at the circuit points 57 and 58. When automatic gain control action occurs, this D.C. voltage would vary, which would result in a low frequency signal, which would be amplified and which would appear in the output. Furthermore, at low frequencies, the filtering action of circuit 18 is less effective. As a result, a ripple component will be present on the D.C. voltage output from circuit 18. If the diode system were not balanced, this ripple would appear at the circuit points 57 and 58 and be amplified. The amplified ripple would be applied to the circuit 18 and would increase the ripple on the D.C. output from the circuit 18. The increased ripple would appear at circuit points 57 and 58. Thus, the action is cumulative and could cause a low frequency oscillation. The attenuation of the ripple voltage by the filter and by the balanced drive must be greater than the gain around the loop or oscillation could result.

In the circuit of FIGURE 3, two attenuators are shown connected to the balanced drive circuit. However, any number of attenuators may be connected to the drive circuit, as long as the current rating of transistors 19 and 20 is not exceeded.

The invention has been described for application in a seismic amplifier as this is the application for which the invention is primarily intended. The invention, of course, is applicable to other amplifiers which have the same or similar problems.

The above description is of a preferred embodiment of the invention and many modifications may be made thereto without departing from the spirit and scope of the invention which is limited only as defined in the appended claims.

What is claimed is:

1. In combination, a signal transmission line connected between a source and a load, means for variably attenuating the signal on said line comprising a variable impedance in shunt with a portion of said line including a pair of series connected diodes poled in the same direction, the junction of said pair of diodes being connected to the transmission line, the impedance of each of said diodes being determined by the magnitude and polarity of the voltage across its terminals, first means connected to one end terminal of said series connected pair of diodes for placing a voltage of predetermined magnitude and polarity at said terminal and means connected to the other end terminal of said series connected pair of diodes and responsive to said first means for placing a voltage on said other end terminal equal to magnitude to the voltage placed on said one end terminal and opposite in polarity.

2. A device as set forth in claim 1 wherein said first means is responsive to the output of the transmission line.

3. In combination, a signal transmission line connected between a source and a load, means for variably attenuating the signals on said line comprising a variable impedance in shunt with a portion of said line including a first pair of series connected elements, the impedance of each of said elements being determined by the magnitude and polarity of the voltage across its terminals, a second pair of series connected impedance elements in shunt with said first pair of elements, first means connected to one junction of said first and second pair of impedance elements for placing a voltage of predetermined magnitude and polarity at said junction, and means connected to the other junction of said first and second pair of impedance elements and responsive to said first means for placing a voltage on said other junction equal in magnitude to the voltage placed on said one junction and opposite in polarity.

4. A device as set forth in claim 3 wherein the first pair of series connected elements are series connected diodes poled in the same direction.

5. A device as set forth in claim 4 wherein the junction of said series connected diodes is connected to the transmission line.

6. A device as set forth in claim 5 wherein said first means is responsive to the output of the transmission line.

7. In combination with a signal transmission line connected between a source and a load, means shunting said line for variably attenuating the signals on said line comprising:

(*a*) a resistor connected in series with said line between said source and said load, (*b*) a pair of series-connected semiconductor diodes poled in the same direction, the juncture adjacent terminals of said pair of diodes being connected to said line at a point between said resistor and said load, (*c*) a pair of like resistors connected in series between the remaining terminals of said pair of diodes, (*d*) first means having an output connected to the remaining terminal of one of said pair of diodes and adapted to apply a first voltage thereto having a predetermined magnitude and polarity, (*e*) and second means having an output connected to the remaining terminal of the other of said pair of diodes and adapted to apply a second voltage thereto having a magnitude equal to said first voltage but of opposite polarity, said second means having an input connected to said juncture of said pair of like resistors and being responsive to the potential thereon.

References Cited in the file of this patent

UNITED STATES PATENTS

| | | |
|---|---|---|
| 2,021,920 | Norwine | Nov. 26, 1935 |
| 2,329,558 | Scherbatskoy | Sept. 14, 1943 |
| 2,391,801 | Schade | Dec. 25, 1945 |
| 2,638,578 | Piety | May 12, 1953 |
| 2,663,002 | McManis et al. | Dec. 15, 1953 |
| 2,775,714 | Curtis | Dec. 25, 1956 |
| 2,833,980 | Hedgcock et al. | May 6, 1958 |
| 2,929,015 | Fleming | Mar. 15, 1960 |
| 2,952,006 | McCarter | Sept. 6, 1960 |
| 2,984,780 | Koletsky | May 16, 1961 |